United States Patent
Chen et al.

(10) Patent No.: US 6,953,742 B2
(45) Date of Patent: *Oct. 11, 2005

(54) TANTALUM BARRIER LAYER FOR COPPER METALLIZATION

(75) Inventors: Ling Chen, Sunnyvale, CA (US); Seshadri Ganguli, Sunnyvale, CA (US); Wei Cao, Milpitas, CA (US); Christophe Marcadal, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/693,775

(22) Filed: Oct. 25, 2003

(65) Prior Publication Data

US 2005/0074968 A1 Apr. 7, 2005

Related U.S. Application Data

(62) Division of application No. 10/290,746, filed on Nov. 7, 2002, now Pat. No. 6,660,622, which is a continuation of application No. 09/704,161, filed on Nov. 1, 2000, now Pat. No. 6,498,091.

(51) Int. Cl.$^7$ ......................................... H01L 21/4763
(52) U.S. Cl. ........................ 438/622; 438/643; 438/687
(58) Field of Search ............................... 438/622, 638, 438/643, 644, 648, 678, 687

(56) References Cited

U.S. PATENT DOCUMENTS

| | | | |
|---|---|---|---|
| 5,770,519 A | 6/1998 | Klein et al. | 438/639 |
| 5,846,332 A | 12/1998 | Zhao et al. | 118/728 |
| 5,933,753 A | 8/1999 | Simon et al. | 438/629 |
| 5,985,762 A | 11/1999 | Geffken et al. | 438/687 |
| 6,100,587 A | * 8/2000 | Merchant et al. | 257/751 |
| 6,106,625 A | 8/2000 | Koai et al. | 118/715 |
| 6,136,707 A | * 10/2000 | Cohen | 438/687 |
| 6,265,313 B1 | 7/2001 | Huang et al. | 438/687 |
| 6,277,249 B1 | 8/2001 | Gopalraja et al. | 204/192.12 |
| 6,284,657 B1 | 9/2001 | Chooi et al. | 438/687 |
| 6,287,977 B1 | 9/2001 | Hashim et al. | 438/722 |
| 6,294,458 B1 | 9/2001 | Zhang et al. | 438/627 |
| 6,306,732 B1 | 10/2001 | Brown | 438/468 |
| 6,328,871 B1 | * 12/2001 | Ding et al. | 205/183 |
| 6,368,954 B1 | * 4/2002 | Lopatin et al. | 438/627 |
| 6,391,785 B1 | * 5/2002 | Satta et al. | 438/704 |
| 6,498,091 B1 | * 12/2002 | Chen et al. | 438/627 |

FOREIGN PATENT DOCUMENTS

| | | |
|---|---|---|
| JP | XP-002223600 | 5/2000 |
| JP | 2000-323571 | 11/2000 |

OTHER PUBLICATIONS

Yamagihshi et al., "TEM/SEM Investigation and Electrical Evaluation of a Bottomless 1–PVS Ta(N) Barrier in a Dual Mask", *Advanced Metallization Conference 2000, Proceedings of the Conference 2000, Advanced Metallization Conference 2000, Proceedings of the Conference, San Diego, CA, USA*, Oct. 2–5, 2000, 279–285 pp.

* cited by examiner

*Primary Examiner*—Tuan H. Nguyen
(74) *Attorney, Agent, or Firm*—Charles S. Guenzer

(57) ABSTRACT

A method of forming barrier layers in a via hole extending through an inter-level dielectric layer and including a preformed first barrier coated onto the bottom and sidewalls of the via holes. In a single plasma sputter reactor, a first step sputters the wafer rather than the target with high energy ions to remove the barrier layer from the bottom of the via but not from the sidewalls and a second step sputter deposits a second barrier layer, for example of Ta/TaN, onto the via bottom and sidewalls. The two steps may be differentiated by power applied to the target, by chamber pressure, or by wafer bias. The second step may include the simultaneous removal of the first barrier layer from the via bottom and sputter deposition of the second barrier layer onto the via sidewalls.

36 Claims, 7 Drawing Sheets

TANTALUM BARRIER LAYER FOR COPPER METALLIZATION

RELATED APPLICATION

This application is a division of Ser. No. 10/290,746, filed Nov. 7, 2002, now issued U.S. Pat. No. 6,660,662, which is a continuation of Ser. No. 09/704,161, filed Nov. 1, 2000, now issued as U.S. Pat. No. 6,498,091.

FIELD OF THE INVENTION

The invention relates generally to processes for formation of vertical interconnects in integrated circuits. In particular, the invention relates to a tantalum barrier layer for copper metallization.

BACKGROUND ART

Modern integrated circuits include several levels of metallization formed over the active semiconductor circuitry formed in the substrate, most commonly a silicon wafer. The multiple metallization layers are required to interconnect the millions to tens of millions of discrete semiconductor devices formed in a single integrated circuit. For advanced microprocessors, there may be five or more levels of metallization.

Each metallization layer includes a dielectric layer, for example, of silicon dioxide or possibly a low-k dielectric material deposited over the previous layer, a via (or contact) hole etched through the dielectric layer, and a metallization including a vertical metallic plug filled into the hole and a horizontal interconnect formed on top of the dielectric layer.

The formation of vias has become increasingly crucial with the continuing shrinkage of critical dimensions and the transition to copper rather than aluminum interconnects. Contacts to underlying silicon will for the most part not be explicitly described hereafter but can equally benefit from the various aspects of the invention.

A generic via is illustrated in the cross-sectional view of FIG. 1. It includes a lower dielectric layer 12 (which in the case of a contact is a silicon-containing layer) having formed therein a conductive feature 14, such as another metallization or, in the case of a contact, a contact region of a transistor. An upper level dielectric layer 16 overlies the lower dielectric layer 12 and the conductive feature 14. Advanced plasma etching processes etch a via hole 18 through the upper dielectric layer 16 to the vicinity of the conductive feature 14. This explanation avoids many details about etch stop layers, horizontal interconnects, and advanced structures, particularly including dual damascene, but the fundamental concepts for the invention remain the same.

Prior to filling metallization into the via hole 18, the hole is lined with a barrier layer 20 to prevent the diffusion of aluminum or copper into the dielectric 16, which would short out the dielectric between neighboring via, or the diffusion of oxygen from the dielectric 16 into the metallization, which reduces the conductivity of the plug. Only thereafter is a metallization plug 22 filled into the via hole 18. In the case of copper metallization, the filling process typically includes a physical vapor deposition or sputtering (PVD) deposition of a copper seed layer followed by an electrochemical plating (ECP) of copper into the hole.

The barrier structure has become increasingly important as the lateral critical dimension has shrunk to 0.25 $\mu$m and below while the vertical dimension has remained virtually static at between 0.7 and 1.51 $\mu$m. As a result, the aspect ratio of the via hole 18 has increased, and the electrical resistance of the vertical electrical metallization has become increasingly important. This emphasis on reduced vertical impedance has been further heightened by the substitution of copper for aluminum as the most desired metallization since copper has a lower bulk resistivity. However, the controlling parameter is the total resistance along a path, including the resistance through the bottom barrier layer portion 24 at the bottom of the via 18. Particularly in the case of an inter-metal dielectric between two metallizations of the same metal, there is no need to include the bottom barrier layer portion 24 since the copper or other metal in the via 22 will be contacting a same metal in the conductive feature 14.

In U.S. Pat. No. 5,985,762, Geffken et al. have disclosed directionally etching away the barrier layer exposed on horizontal surfaces of a copper dual-damascene structure but leaving the barrier layer on the sidewalls to protect the dielectric sidewalls from copper sputtered from the underlying copper feature. This process requires presumably a separate etching chamber. Furthermore, the process deleteriously also removes the barrier at the bottom of the trench in a dual-damascene structure. They accordingly deposit another conformal barrier layer, which remains under the metallized via.

In commonly assigned U.S. patent application Ser. No. 09/518,180 filed Mar. 2, 2000, now issued as U.S. Pat. No. 6,277,249, Gopalraja et al. have suggested that a self-ionized plasma sputter deposition of a copper seed layer for a copper metallization 22 can be used to remove the bottom barrier layer portion 24.

Accordingly, it is desired to provide a structure and method of making it which reduces the contact resistance at the bottom of a via.

It is further desired to provide such structure and method without unduly complicating the integrated circuit fabrication process.

SUMMARY OF THE INVENTION

One aspect of the invention includes removing a barrier layer formed at the bottom of a via by a sputter etching process performed in a plasma sputter deposition chamber. The same sputter deposition chamber may advantageously be used to then deposit a second barrier layer.

The invention also includes the aspect of removing the barrier layer at the bottom of the via and simultaneously depositing a second barrier layer on vertically extending sidewalls.

Another aspect of the invention includes removing the barrier layer at the bottom of the via while not removing the barrier layer from some other horizontally extending surfaces. The selective removal can be effected by simultaneously sputter depositing a second barrier layer on these other horizontal surfaces. The selective deposition of the second barrier layer can be advantageously followed by the sputter deposition in the same sputter reactor of another layer of the second barrier layer under different conditions such that the additional layer is also deposited on the via bottom.

The combined process may be performed in an inductively coupled plasma sputter reactor in which, during the removal step, the sputtering target is not energized and thus not sputtered, but, during the deposition of the second barrier layer, it is energized to be sputtered. During the removal step, the inductive coil generates a plasma of the sputtering working gas, and the wafer is biased to attract the working gas ions.

The invention includes structures achievable by the invention in which a barrier layer is coated on the sides of the hole but not its bottom. It also includes a dual-damascene structure in which the barrier is coated on the trench floor but not on the via bottom.

DETAILED DESCRIPTION OF THE PREFERRED EMBODIMENTS

Figure 1:
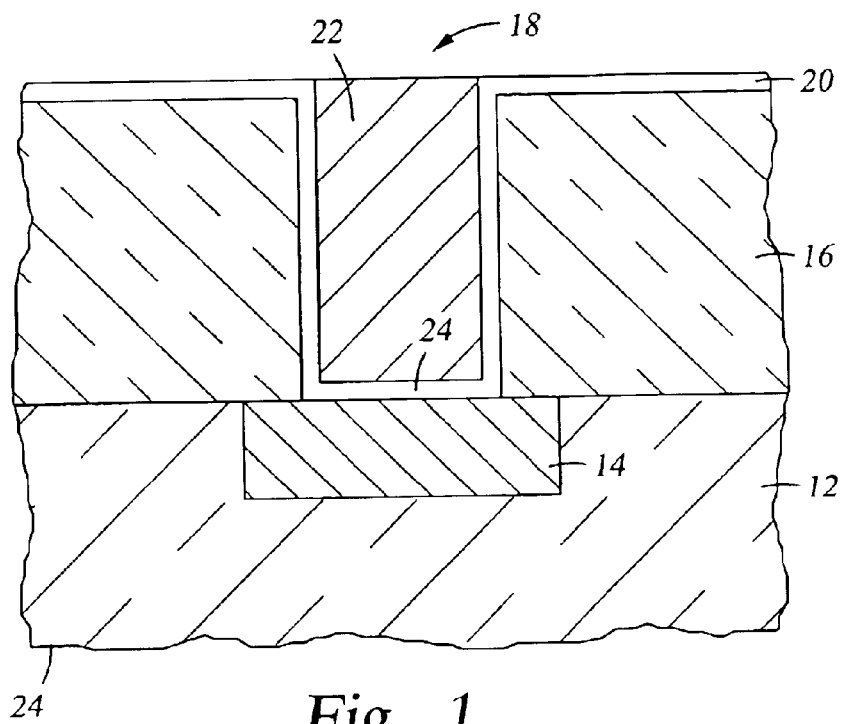
FIG. 1 is a cross-sectional view of a generic via structure of the prior art.
Figure 2:
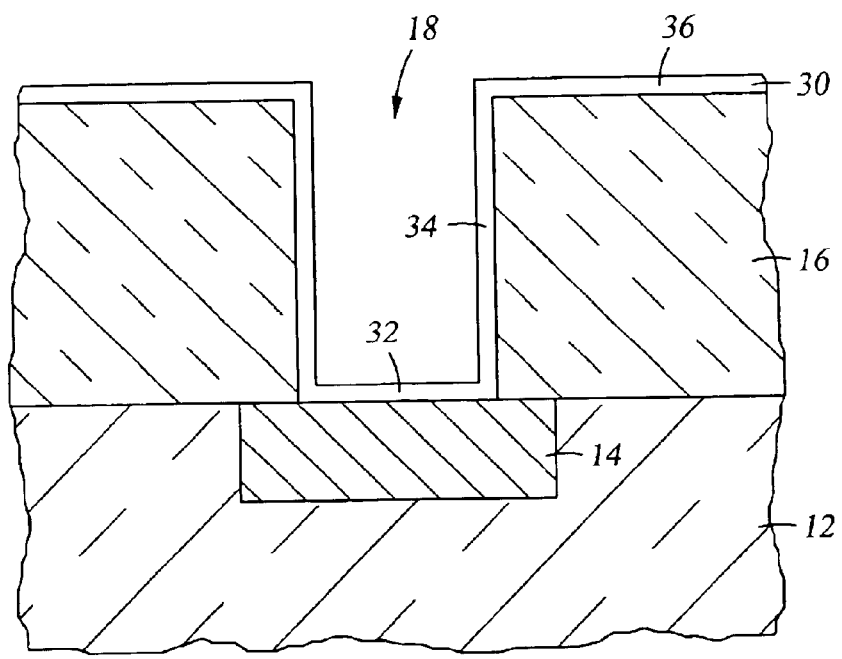
FIG. 2 is a cross-sectional view of a via structure coated with a CVD barrier layer.

It is has been found useful to form a via barrier in two chambers. The first step is performed in a CVD (chemical vapor deposition) chamber in which a CVD barrier layer 30, as illustrated in the cross-sectional view of FIG. 2, is first deposited having a composition of titanium silicon nitride (TiSiN). Again, the illustrated structure ignores features such as etch stop layers and dual-damascene holes. The CVD barrier layer 30 may be formed by a three-step process in the TxZ plasma CVD reactor, available from Applied Materials, Inc. of Santa Clara, Calif. Zhao et al. describe a version of this chamber and a TiN deposition procedure in U.S. Pat. No. 5,846,332. In the first step, a TiN layer is deposited to a thickness of about 5 nm by a well known process of thermal chemical vapor deposition at about 350° C. using tetrakis-dimethyl-amido titanium (TDMAT) as the precursor gas. Koai et al. describe an alternative plasma CVD process and chamber in U.S. Pat. No. 6,106,625. The thermal CVD is followed by a plasma treatment in the same chamber of the wafer held at 350° C. The same chamber is used for the third step of a thermal soak of the wafer in the presence of silane ($SiH_4$) to convert the TiN to TiSiN. The CVD process is nearly conformal and coats the sidewalls and bottom of the via hole including a CVD barrier bottom portion 32, a CVD barrier sidewall portion 34, and a CVD barrier field portion 36 on top of the dielectric layer 16.

Following the formation of the CVD barrier layer 30, the substrate is transferred to a physical vapor deposition (PVD) chamber in which a tantalum target is used as the sputtering target. The PVD chamber should be one which is capable of producing a relatively high ionization fraction of sputtered atoms, for example, above 10%. The chamber preferably also has the capability of biasing the pedestal electrode supporting the electrode. Typically, the biasing involves applying an RF bias signal, for example, at 13.56 MHz to the pedestal electrode. The RF power creates a negative DC bias on the pedestal and thus accelerates positively charged sputtered metal ions to the wafer.

One reactor satisfying these requirements is the Endura IMP (ion metal plating) sputter reactor available from Applied Materials. This reactor uses an inductive coil to couple RF power into a remote plasma source region. This reactor operates at relatively high argon pressures of about 20 milliTorr to produce a large volume of a high-density plasma, that is, one having an ionization fraction of at least $10^{11}$ $cm^{-3}$. Metal ionization fractions may exceed 50% or even 75% in an IMP reactor.

Two other reactors being developed by Applied Materials can also be used for the process of the invention. Both are more conventional DC diode magnetron reactors not relying on RF inductive coupling to create the plasma. Various techniques are used to create a relatively high density plasma in a small portion of the target. The magnetron is scanned over the back of target to provide the required uniformity. Both these reactors can be operated at relatively low pressures of about 1 milliTorr or somewhat less. Their metal ionization fractions are somewhat lower, in the 10% to 50% range. Fu describes an SIP (self-ionized plasma) reactor in U.S. patent application Ser. No. 09/373,097, filed Aug. 12, 1999, now issued as U.S. Pat. No. 6,183,614. This reactor uses a flat target and a small unbalanced magnetron having a strong magnetic pole of one polarity surrounding a weaker magnetic pole of the other polarity. Praburam et al. describe an SIP+ reactor in U.S. patent application Ser. No. 09/518,180, filed Mar. 2, 2000, now issued as U.S. Pat. No. 6,277,249. This reactor includes a target having a large annular groove or vault formed in its side facing the wafer. Various magnets are placed adjacent to the sidewalls and roof of the vault. Very high plasma densities are formed within portions of the vault, thereby increasing the metal ionization fraction.

According to the invention, the same PVD chamber performs two steps. The first step has the effect of removing the CVD barrier layer at the bottom of the via hole, and the second step completes the deposition of the PVD barrier layer. Two embodiments of the two-step process will be described. In the first embodiment, the first step deposits no material and only sputters the CVD barrier layer. In the second embodiment, the first step combines removal at the bottom of the via hole and deposition of some PVD barrier material in areas other than the bottom of the via hole.

Figure 3:
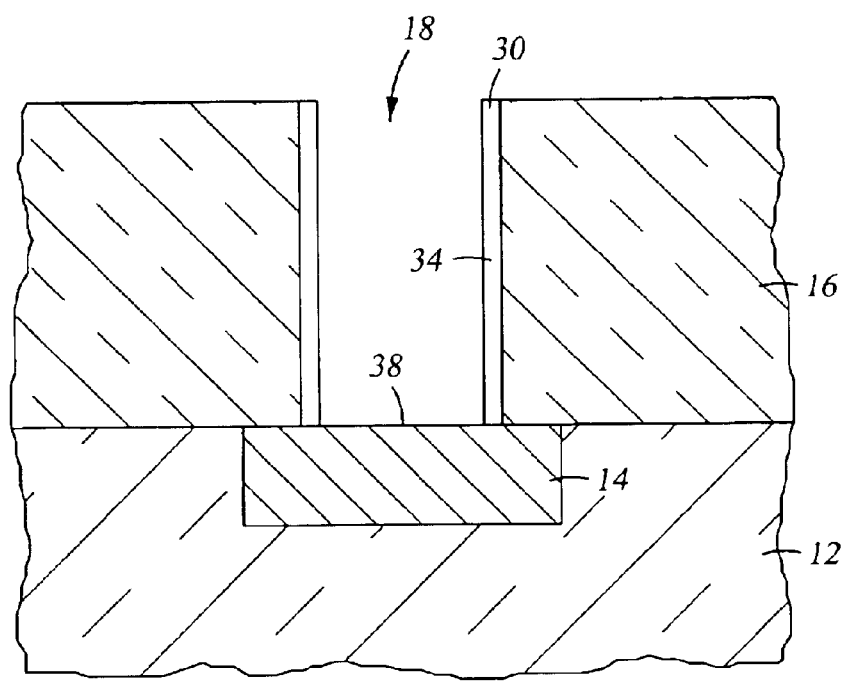
FIG. 3 is a cross-sectional view of the via structure of FIG. 2 with the bottom portion of the CVD barrier layer being removed in a PVD chamber.
Figure 4:
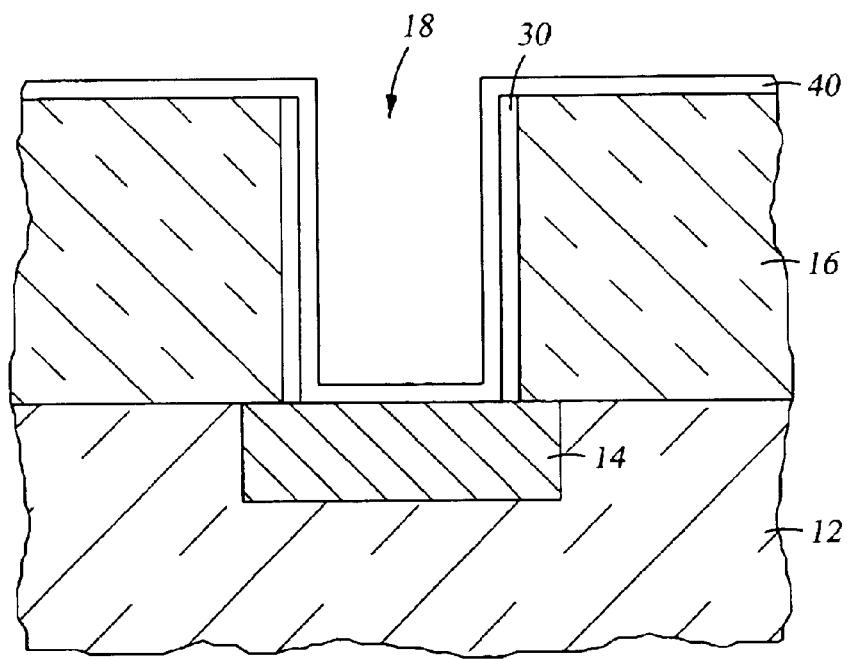
FIG. 4 is a cross-sectional view of the via structure of FIG. 3 further coated with a PVD barrier layer.

In the first embodiment, particularly as practiced in an IMP chamber configured for sputter deposition of a barrier layer, an argon plasma is formed and the pedestal electrode is RF biased to create a significant negative DC self-bias to strongly attract the argon ions to the pedestal. The IMP chamber allows the formation of an argon plasma without sputtering the tantalum target by exciting the plasma through the inductive coil and not significantly DC biasing the target. The highly directional high-energy argon ions incident on the wafer remove or sputter the CVD barrier bottom and field portions 32, 36. That is, a sputtering process is performed on the wafer, not a sputter deposition process. However, the argon ions do not remove the CVD barrier sidewall portion 34, as illustrated in the cross-sectional view of FIG. 3, because the ions are mostly traveling parallel to the sidewall. In fact, some of the barrier material sputtered from the CVD barrier bottom portion 32 will deposit on the sidewall. Further, the argon ions may even slightly etch into the exposed face 38 of the underlying metallic feature 14. The etching of the metallic feature 14 may be advantageous as a pre-cleaning step to remove any oxide that has spontaneously formed there. The removal of the CVD barrier bottom portion 32 at the bottom of the via hole 18 is advantageous because the TiSiN CVD bottom barrier would increase the contact resistance between the plug to be formed in the via hole 18 and the conductive feature. Gopalraja et al. have described in the above cited patent application a similar sputter removal of a barrier layer during sputter deposition of a copper seed layer.

Thereafter, in a second step performed in the same barrier PVD reactor, a PVD barrier layer 40 is sputter deposited, with the chamber conditions adjusted to produce a sufficiently high energy in the sputtered metal ions that they coat not only the top of the dielectric layer 16 but also over the CVD barrier layer 30 on the sidewalls of the via hole 18 (although the sidewall coverage is small), and at the bottom of the via hole 18 in direct contact to the metallic feature 14. The second step preferably at least begins with the sputter deposition of tantalum or other barrier metal. The second step may include a subsequent deposition of tantalum nitride by admitting nitrogen into the plasma reactor to effect reactive sputtering.

Exemplary process conditions for the two steps are presented in TABLE 1 for the IMP reactor.

TABLE 1

|  | Step 1 | Step 2 |
|---|---|---|
| Target Power (kW) | 0 | 1 |
| Coil Power (kW) | 1 | 2.5 |
| Pressure (milliTorr) | 1 | 38 |
| Wafer Bias Power (W) | 600 | 350 |
| Bias Duty Cycle (%) | 100 | 50 |

These parameters show that the IMP chamber is being operated in the wafer pre-clean mode in the first step and in an ionized sputter deposition mode in the second step.

Figure 5:
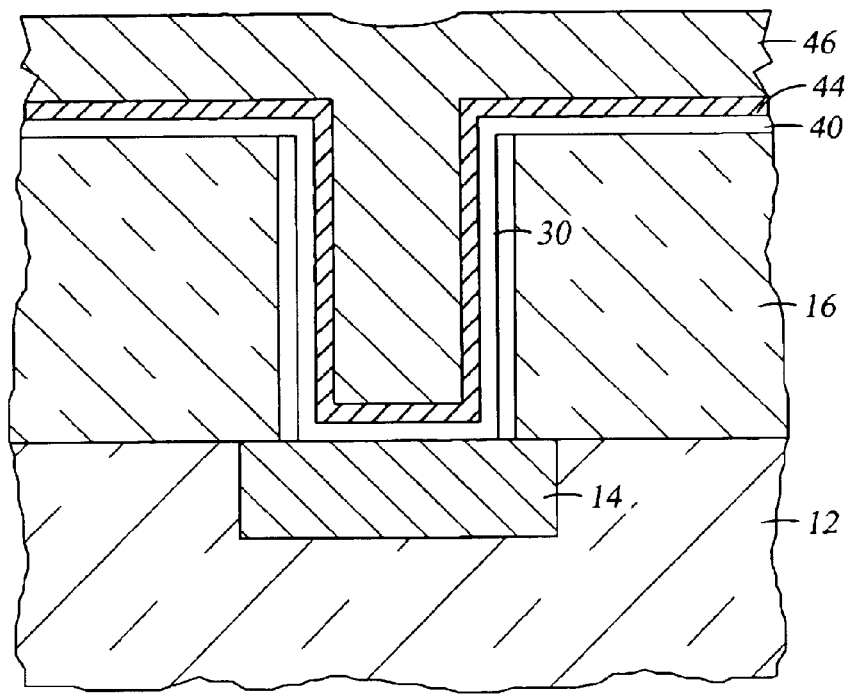
FIG. 5 is a cross-sectional view of the via structure of FIG. 4 coated with a copper seed layer and then electrochemically filled with copper.

The wafer is then moved to a copper PVD chamber for deposition of a thin copper seed layer 44, illustrated in the cross-sectional view of FIG. 5. The copper seed layer 44 is needed to act as an electrode for the subsequent electrochemical plating (ECP) of copper and to nucleate the ECP copper. The copper seed layer 44 is preferably performed in either an IMP reactor, a SIP reactor, or a SIP+ reactor although other sputter reactors may be satisfactory. Thereafter, the via hole is filled and overfilled with a copper layer 46 deposited by an ECP process. The excess copper as well as most typically the field portions of the various barriers are removed by chemical mechanical polishing (CMP), which stops on the hard dielectric 16 to produce the structure of FIG. 6. It is assumed that a dual-damascene or similar interconnect structure is used so that the remaining metal 48 acts both as a via to the underlying metallic feature 14 and as a horizontal interconnect just below the surface of the dielectric layer 16.

In the SIP and SIP+ sputter reactors as currently configured as well as in other typical diode reactors, the target needs to be powered to create a plasma. In the case of a Ta/TaN barrier, tantalum is being sputtered from the target in the first step. However, it is possible to divide the tantalum sputtering into two steps, the first producing tantalum ions having high energy, the second producing tantalum ions having lower energy so that the first step operates in the sputter removal mode with respect to the wafer while the second step operates in the sputter deposition mode. But, the geometry of the via hole makes the situation more complex.

Figure 7:
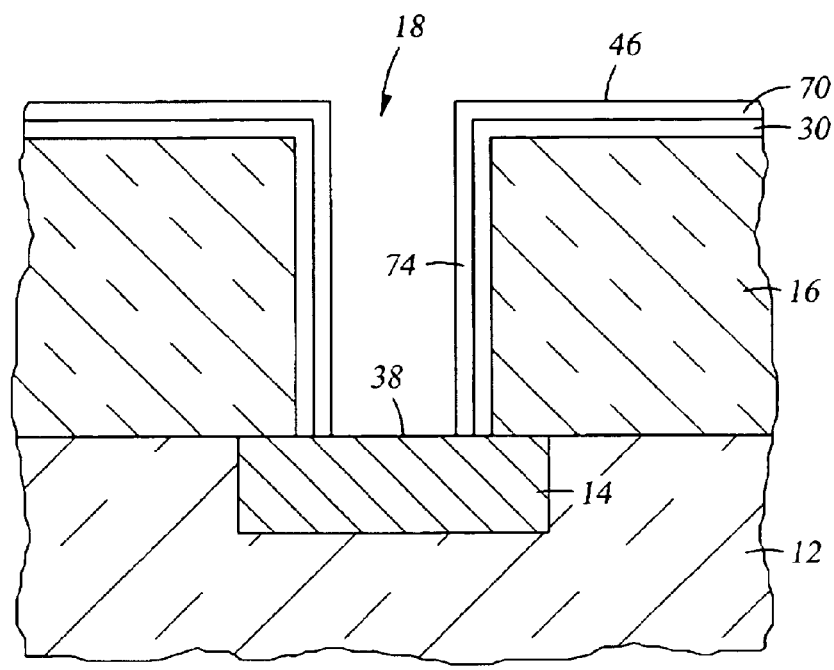
FIG. 7 is a cross-sectional view of a via structure with the CVD barrier being removed from the bottom of the via at the same time that a first PVD barrier layer is deposited at least on the via sidewalls and possibly in the field area over the top of the dielectric.

In the first step, chamber conditions are adjusted to produce tantalum ions having relatively high energies as they are attracted to the wafer to deposit, as illustrated in the cross-sectional view of FIG. 7, a first PVD barrier layer 70, typically of tantalum for copper metallization. As a result, the ions that are attracted to the bottom of the via 18 have such high energy that, not only do they not deposit on the bottom, they sputter away the underlying CVD barrier bottom portion 32 of FIG. 2 and may even slightly etch into the exposed face 38 of the underlying metallic feature 14. With the finite tantalum ion flux, a sidewall portion 74 of the first PVD barrier layer 70 is formed on the sides of the via hole 18, partially from the metal ions reflected off the via bottom. The situation in the field area atop the dielectric layer 16 is more complex. If the tantalum ion fraction is high and the ion energy is sufficiently high, then the field portions of the first PVD barrier layer 70 does not form and instead the field portion 36 of the CVD barrier is removed. However, in SIP and SIP+ sputtering, it is possible to balance the ion and neutral fractions. The neutral fraction does not reach the protected bottom of the via hole but does reach the field region with modest energy because they are not affected by pedestal biasing. Therefore, they can deposit on the field region more quickly than the energetic ions are removing material there. Therefore, it is possible to achieve a net deposit of the first PVD barrier layer 70 over the field area. Gopalraja et al. have described in the above cited patent application a similar sputter removal of a barrier layer during sputter deposition of a copper seed layer.

Figure 8:
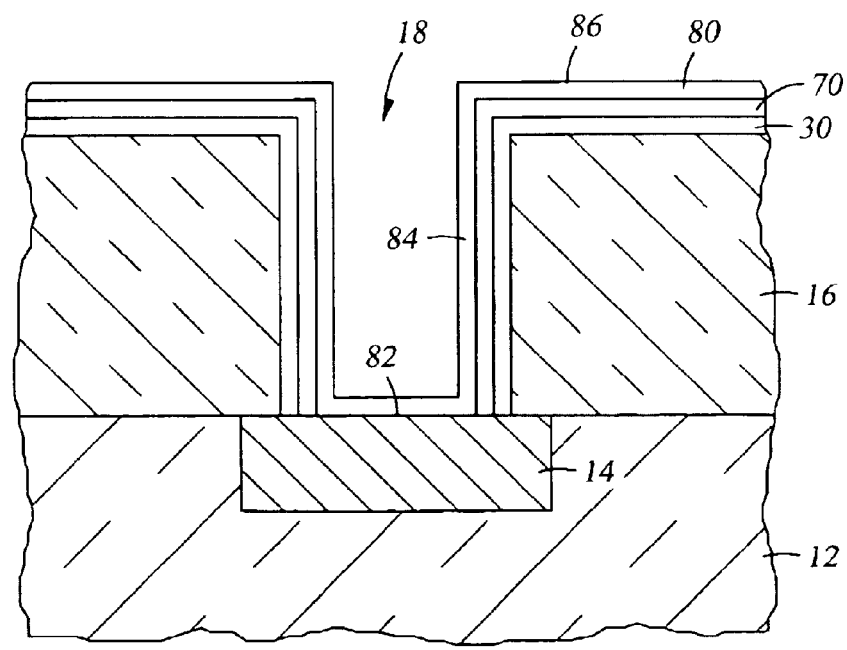
FIG. 8 is a cross-sectional view of the via structure of FIG. 7 with the further deposition of a second PVD barrier layer.

Thereafter, in a second step of the PVD barrier deposition, a second PVD barrier layer 80, illustrated in FIG. 8, is deposited in the same PVD chamber with the chamber conditions adjusted to produce a lower energy for the sputtered metal ions. With the lower energies, the second PVD barrier layer 80 forms with a bottom portion 82, a sidewall portion 84, and a field portion 86. The second step preferably at least begins with the sputter deposition of tantalum or other barrier metal. The second step may include a subsequent deposition of titanium nitride by admitting nitrogen into the plasma reactor to effect reactive sputtering.

In the first step, chamber conditions are adjusted to produce tantalum ions having relatively high energies as they are attracted to the wafer to deposit, as illustrated in the cross-sectional view of FIG. 7, a first PVD barrier layer 70, typically of tantalum for copper metallization. As a result, the ions that are attracted to the bottom of the via 18 have such high energy that, not only do they not deposit on the bottom, they sputter away the underlying CVD barrier bottom portion 32 of FIG. 2 and may even slightly etch into the exposed face 38 of the underlying metallic feature 14. With the finite tantalum ion flux, a sidewall portion 74 of the first PVD barrier layer 70 is formed on the sides of the via hole 18, partially from the metal ions reflected off the via bottom. The situation in the field area atop the dielectric layer 16 is more complex. If the tantalum ion fraction is high and the ion energy is sufficiently high, then the field portions of the first PVD barrier layer 70 does not form and instead the field portion 36 of the CVD barrier is removed. However, in SIP and SIP+ sputtering, it is possible to balance the ion and neutral fractions. The neutral fraction does not reach the protected bottom of the via hole but does reach the field region with modest energy because they are not affected by pedestal biasing. Therefore, they can deposit on the field region more quickly than the energetic ions are removing material there. Therefore, it is possible to achieve a net deposit of the first PVD barrier layer 70 over the field area. Gopalraja et al. have described in the above cited patent application a similar sputter removal of a barrier layer during sputter deposition of a copper seed layer.

Thereafter, in a second step of the PVD barrier deposition, a second PVD barrier layer 80, illustrated in FIG. 8, is deposited in the same PVD chamber with the chamber conditions adjusted to produce a lower energy for the sputtered metal ions. With the lower energies, the second PVD barrier layer 80 forms with a bottom portion 82, a sidewall portion 84, and a field portion 86. The second step preferably at least begins with the sputter deposition of tantalum or other barrier metal. The second step may include a subsequent deposition of titanium nitride by admitting nitrogen into the plasma reactor to effect reactive sputtering.

Several methods are available to control the metal ion energy. Increasing the RF bias applied to the pedestal electrode through a coupling capacitor will increase the magnitude of the negative DC self-bias and thus increase the energy of the metal ions. At least in the case of SIP and SIP+, either decreasing the chamber pressure or increasing the target power will also increase the DC self-bias. Thus, the second PVD sputtering step should be performed at lower bias power, higher pressure, or lower target power than is the first PVD sputtering step. Of course, adjustment of some combination of the three controls can be used.

Figure 6:
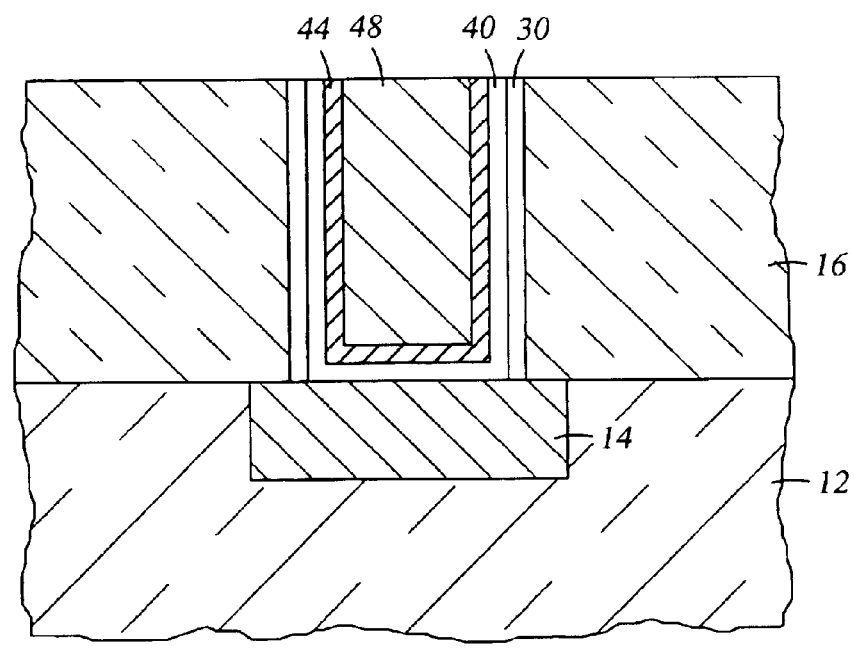
FIG. 6 is a cross-sectional view of the vis structure of FIG. 5 after completion of the inter-level dielectric level by chemical mechanical polishing.
Figure 9:
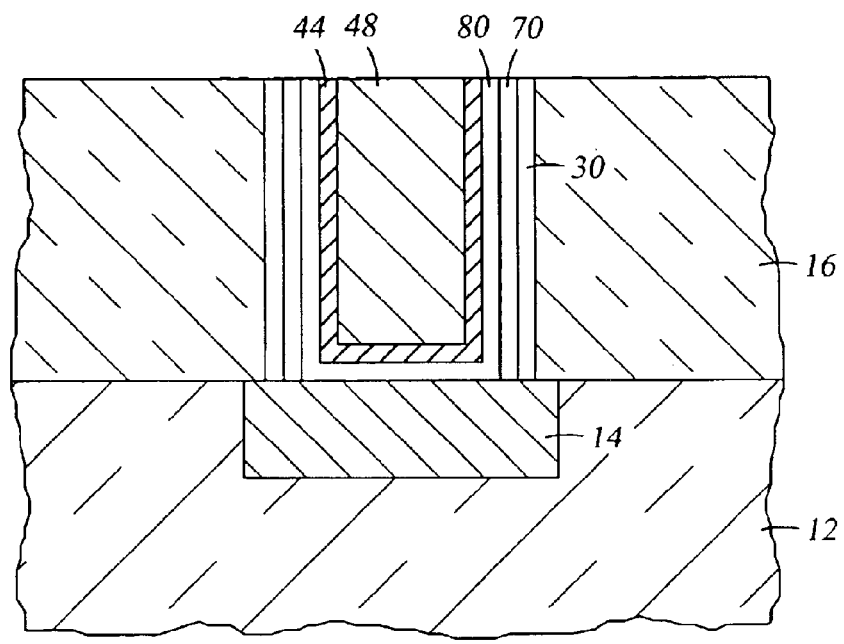
FIG. 9 is a cross-sectional view of the via structure of FIG. 8 after completion of copper metallization.

The previously described steps associated with deposition of the copper seed layer, electroplating of copper, and chemical mechanical polishing are similarly performed to produce the structure of FIG. 9, which differs from that of FIG. 6 by the addition of the sidewall portion of the first PVD barrier layer 70.

Figure 10:
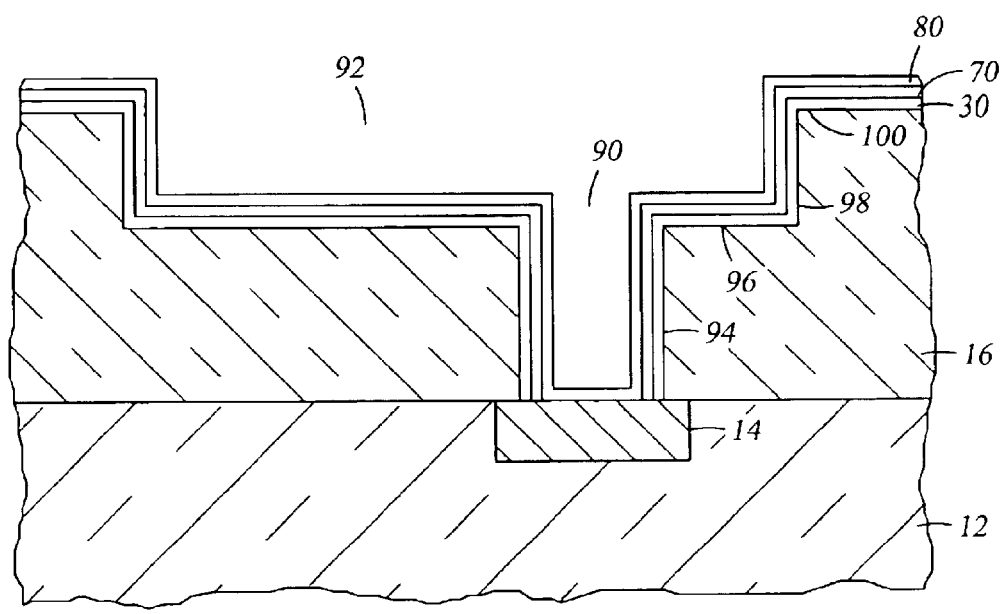
FIG. 10 is a cross-sectional view of a dual-damascene structure after deposition of the barrier and seed layers.

The SIP and SIP+ sputter reactors allow tuning of not only the metal ion energy but the ratio of ions to neutrals. This tunability allows the possibility of very selective removal of the first barrier layer at only the bottom of the via in a dual-damascene structure, as illustrated in the cross-sectional view of FIG. 10. A multi-step etching process is used to etch a dual-damascene hole in the upper dielectric layer 16 including a via hole 90 for connecting to the underlying copper feature 14 and a trench 92 providing horizontal interconnects. Usually, there are multiple via holes 90 and corresponding underlying copper features 14. The underlying copper feature 14 may be a copper-filled trench in the lower metallization level. The trench 92 may have a lateral size only slightly larger than the diameter of the via hole 90, but it typically has a substantially longer length. Etch stop layers and underlying barrier layers are not illustrated.

The CVD barrier layer 30 is conformally deposited over the horizontal and vertical surfaces of the via hole 90 and trench 92 as well as over the field area on top of the upper dielectric layer 16. A first PVD sputtering step with energetic metal ions is used to remove the CVD barrier layer 30 at the bottom of the via holes while depositing a first PVD barrier layer 70 over the CVD barrier layer 30 on the via sidewall 94, the trench floor 96, the trench sidewalls 98, and field area 100 on top of the dielectric layer 16. The differential deposition, particularly on horizontal surfaces, can be achieved because the very narrow access to the high-aspect ratio via hole 90 admits very few neutral metal atoms to the bottom of the via hole 90, and instead the energetic metal ions etch the CVD barrier layer 30 at the via bottom. On the other hand, the trench floor 96 is slightly more exposed in its lateral direction and significantly more exposed in it axial direction. As a result, a substantial number of the neutral metal atoms reach the trench floor 96 and attempt to deposit there. On net, the deposited neutrals prevent the energetic metal ions from significantly etching the underlying CVD barrier layer 30 on the trench floor 96. The field areas of the CVD barrier layer 30 are even more exposed to the neutral metal atoms, and a thicker first PVD barrier layer 70 grows there. A second PVD sputter step preferably performed in the same PVD chamber coats a second PVD barrier layer 80 over the entire exposed surface, including the bottom of the via hole 90.

Gopalraja et al. describe a similar sputter etch and sputter deposition process in U.S. application Ser. No. 09/703,601, now issued as U.S. Pat. No. 6,451,177, incorporated herein by reference in its entirety.

Figure 11:
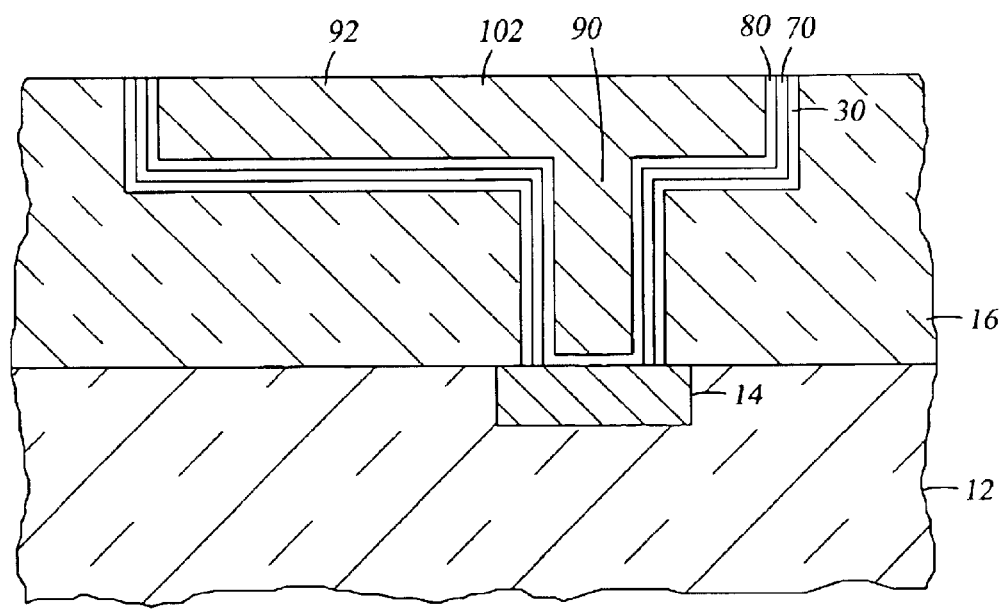
FIG. 11 is a cross-sectional view of the structure of FIG. 10 after electroplating and chemical mechanical polishing.

Thereafter, the copper seed layer (not illustrated here) is deposited, copper is electroplated into the via and trench and over the top of the trench, and the structure is chemical-mechanically polished down to the dielectric layer 16 to produce the metallized dual-damascene structure of FIG. 11, in which a copper metallization 102 fills both the via 90 and the trench 92. This structure is advantageous over that possible with the barrier removal of Geffken et al. in that the trench floor is protected by a complete set of barrier layers preventing vertical diffusion between the oxide layer 16 and copper metallization 102.

The steps described above are part of an integrated process for forming a liner in hole penetrating through a dielectric layer. The process flow is presented in the flow diagram of FIG. 12 and can be performed on a single integrated tool such as that illustrated in FIG. 13. Before entering the system, the via hole is etched through the uppermost dielectric layer down to the underlying metallic feature. The etch may form a dual-damascene structure and involve a more complex structure for the dielectric layer. After the wafer enters the system, in step 110 the wafer is degassed. This operation is usually combined with an orientation step to orient the orientation indicia on the wafer in a predetermined direction. In step 112, the wafer is pre-cleaned by a process including subjecting the wafer to an argon plasma formed by a remote inductive coil with a chamber pressure of about 0.5 Torr with about 300W of RF bias applied to the pedestal electrode. This soft plasma etch removes spontaneous oxidation and other contaminants from the exposed surface.

In step 114, a CVD barrier layer is deposited, typically composed of TiN or TiSiN. As described before, the CVD barrier layer nearly conformally coats the sidewalls and bottom of the via hole as well as the field area on top of the dielectric layer.

Step 116 is a PVD operation that removes the CVD barrier layer at the bottom of the via. Depending upon the sputter chamber being used and the precise process parameters, the first PVD barrier sputter step may coat a first PVD barrier layer on the via sidewalls and possibly on the field area. In a process tuned for dual damascene the first barrier PVD step removes the CVD barrier layer only at the bottom of the via hole but coats the first PVD barrier layer on the trench floor and in the field area. Step 118 sputter deposits another PVD barrier layer on all exposed surfaces including the via bottom, via sidewalls, and field area as well into surfaces of the trench or trenches if any. For a copper metallization, if the first barrier PVD step 116 net deposits the barrier, it is preferably a metallic tantalum deposition. In either case, at least an initial part of the PVD barrier layer deposited in the second barrier PVD step 118 is preferably composed of tantalum. Optionally, a second part of the second PVD barrier layer is composed of tantalum nitride formed by admitting nitrogen into the PVD reactor. The two barrier PVD steps 116, 118 are preferably performed in the same plasma sputter reactor having a tantalum or other barrier metal target.

Finally, a copper seed layer is deposited in step 120, after which the wafer having a complete liner formed thereon is removed from the system. Subsequent steps of electro-chemical plating (ECP) and chemical mechanical polishing (CMP) are performed elsewhere to complete the inter-level metallization. It is also appreciated that the invention does not require ECP or CMP, but may instead use more conventional sputter filling of the via and/or metal lithography of the horizontal interconnects. It is further appreciated that the liner process is not restricted to copper metallization, and the process may be adapted to aluminum metallization.

Figure 12:
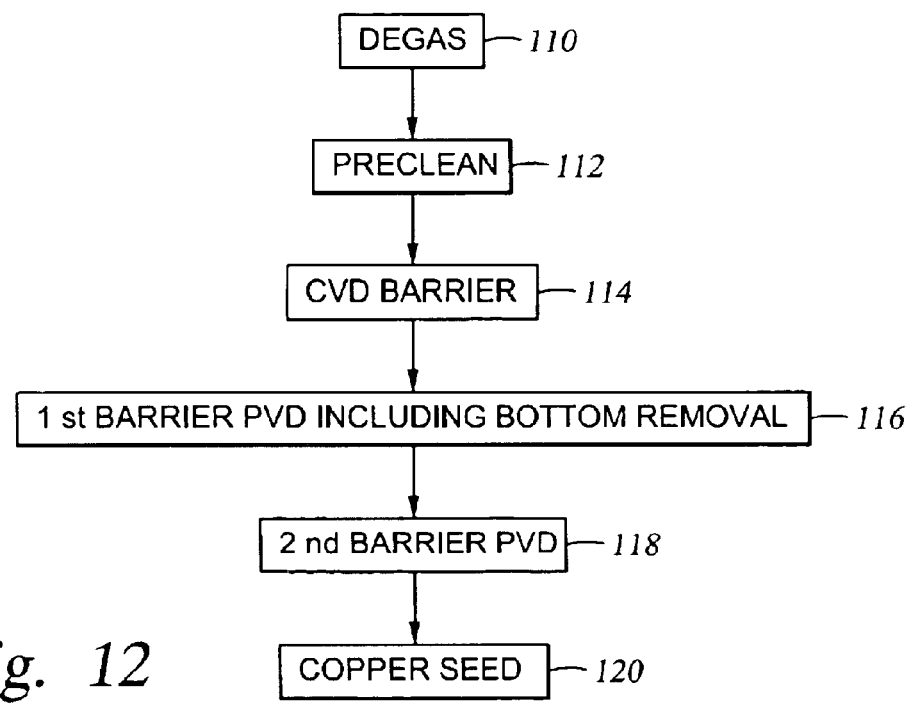
FIG. 12 is a flow diagram of an integrated process liner deposition process.
Figure 13:
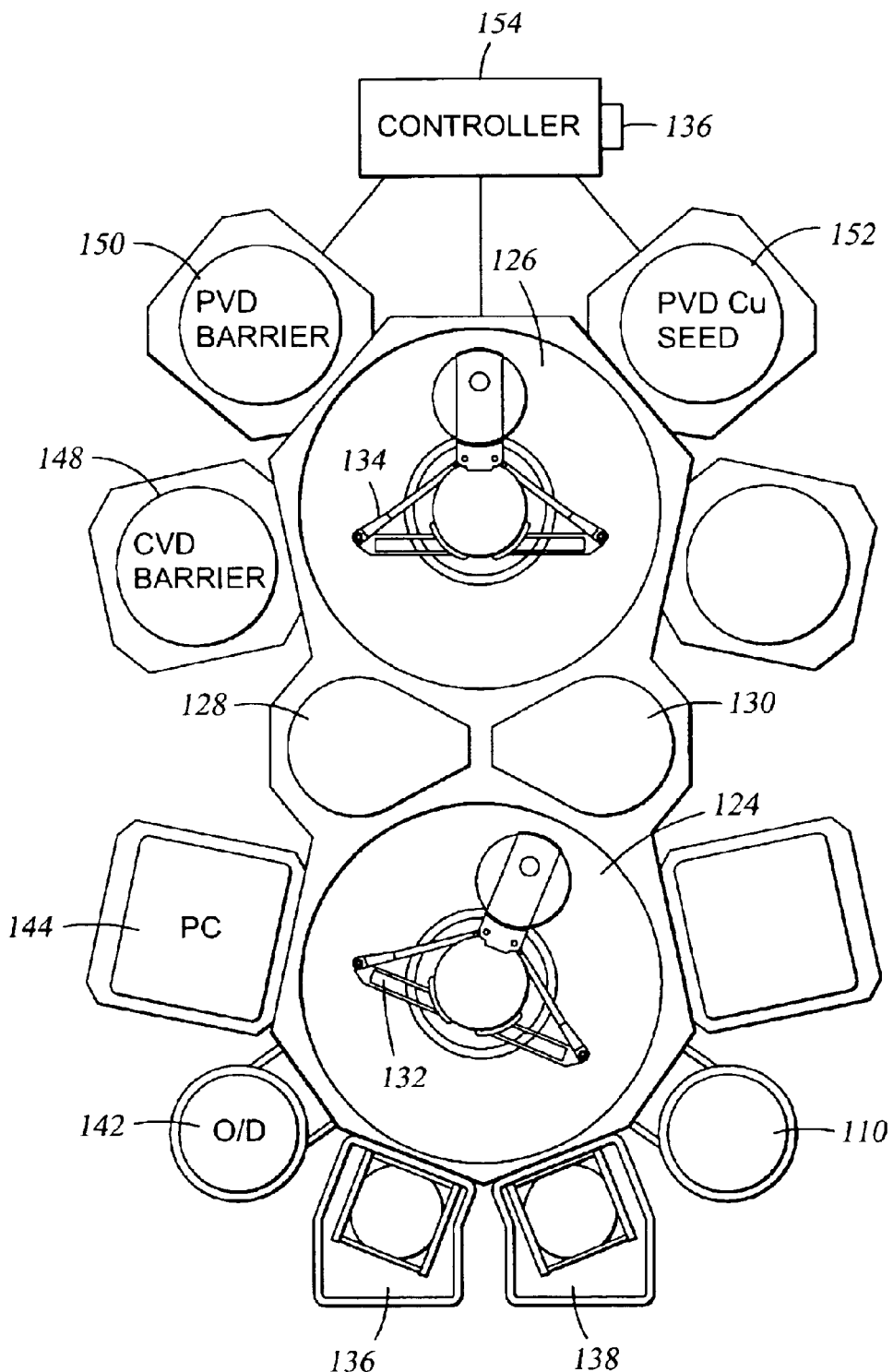
FIG. 13 is schematic plan view of an integrated tool capable of performing the integrated process of FIG. 12.

The integrated process of FIG. 12 may be practiced on an integrated tool, such as the Endura tool illustrated in schematic plan view in FIG. 13 and available from Applied Materials, Inc. The system includes two central vacuum transfer chambers 124, 126 which are interconnected through vacuum locked pass through stations 128, 130 and each of which contains a wafer robot 132, 134 capable of reaching any of multiple stations arranged around the periphery of the respective transfer chambers 124, 126.

Wafers are loaded into and out of the first transfer chamber 124 through wafer cassettes contained in load lock chambers 136, 138. Upon entry, an orient/degas chamber 142 rotates the wafer to the correct orientation and heats it sufficiently to degas it. A pre-clean chamber 144 then subjects the wafer to an argon plasma pre-cleaning.

The wafer is then transferred to the second transfer chamber 126, which is typically held at a higher vacuum than the first transfer chamber 124. A CVD chamber 148 deposits the CVD barrier layer. A PVD chamber 150 may be used for both PVD steps, both the first one operating to remove material on the via bottom and a second one with a lower ion energy to produce net deposition. If desired, the same chamber can be used for reactive sputtering of a nitrided barrier layer. For copper metallization, the PVD chamber 150 typically has a tantalum target. A second PVD chamber 152 is used to deposit the copper seed layer. Thereafter, the wafer with its liner layer completely formed is returned through the first transfer chamber 124 to a cassette in one of the load locks 136, 138. It is appreciated that for higher throughput the empty space on the second transfer chamber 126 can be used for a second CVD barrier chamber 148 or a second PVD barrier chamber 150 depending on their relative processing rates.

A controller 154 is loaded with a process recipe through a removable recording medium 156 and controls the operation of the entire integrated tool.

Although the invention has been described in context of the first barrier layer being deposited by a CVD method, the invention is applicable to structures using first barrier layers deposited by other methods. Atomic layer deposition (ALD) is a process for depositing the barrier one atomic layer at a time. In another example, a first sputtered barrier layer may comprise a first refractory metal, and a second sputtered barrier layer may comprise a second refractory metal requiring another sputter reactor.

It is appreciated that the various barrier layers may be based on different materials than those discussed. The most common barriers are based on the refractory metals titanium, tantalum, and tungsten and their nitrides, but other barriers are possible.

Accordingly, it is seen that the same sputtering chamber can be used for distinctly different effects of removing restricted portions of a liner layer as well as coating over the liner layer and other exposed portions.

What is claimed is:

1. A process for forming a copper interconnect in a substrate including a connect hole vertically extending through an inter-level dielectric layer, comprising the steps of:
   a first step, performed at least partially by atomic layer deposition, of depositing a barrier layer comprising tantalum on sides of said hole;
   a second step of etching said barrier layer at a bottom of said hole selectively to said barrier layer on said sides of said hole;
   a subsequent third step, performed by physical vapor deposition, of depositing a copper seed layer over said barrier layer; and
   filling by electrochemical plating copper into said hole over said copper seed layer.

2. The process of claim 1, wherein said barrier layer comprises tantalum nitride.

3. The process of claim 1, wherein said etching is performed with energetic ions.

4. A process for forming a copper interconnect in a substrate including a connect hole vertically extending through an inter-level dielectric layer, comprising the steps of:
   a first step, performed at least partially by atomic layer deposition, of depositing a barrier layer comprising tantalum on sides of said hole;
   a subsequent second step of etching said barrier layer at the bottom of the hole, wherein second step includes generating an argon plasma and biasing a pedestal electrode supporting said substrate to attract argon ions to said substrate, thereby etching said barrier layer;
   a subsequent third step, performed by physical vapor deposition, of depositing a copper seed layer over said barrier layer; and
   filling by electrochemical plating copper into said hole over said copper seed layer.

5. The process of claim 4, wherein said generating step includes inductively coupling RF power into a plasma reactor containing said pedestal electrode.

6. A process for forming a copper interconnect in a substrate including a connect hole vertically extending through an inter-level dielectric layer, comprising the steps of:
   a first step, performed at least partially by atomic layer deposition, of depositing a barrier layer comprising tantalum on sides of said hole, wherein said first step includes an initial CVD step for depositing a first part of said barrier layer and a subsequent sputtering step for depositing a second part of said barrier layer;
   a second step, performed by physical vapor deposition, of depositing a copper seed layer over said barrier layer; and filling by electrochemical plating copper into said hole over said copper seed layer.

7. A process for forming a copper interconnect in a substrate including a connect hole vertically extending through an inter-level dielectric layer, comprising the sequentially performed steps of:
   a first step, performed by chemical vapor deposition, of depositing a first barrier layer comprising tantalum on sides of said hole;
   a second step, performed by sputtering, of depositing a second barrier layer comprising tantalum on said sides of said hole;
   a third step, performed by physical vapor deposition, of depositing a copper seed layer over said first and second barrier layers; and
   a fourth step, performed by electrochemical plating, of filling copper into said hole over said copper seed layer.

8. The process of claim 7, wherein said chemical vapor deposition comprises atomic layer deposition.

9. The process of claim 7, further comprising a fifth step performed after said first stop performed in a sputter reactor of etching said first barrier layer at the bottom of said hole.

10. The process of claim 9, wherein fifth step includes generating an argon plasma an biasing a pedestal electrode supporting said substrate to attract argon ions to said substrate, thereby etching said barrier layer.

11. The process of claim 10, wherein said generating step includes inductively coupling RF power into a plasma reactor containing said pedestal electrode.

12. A process for forming a copper interconnect in a substrate including a connect hole vertically extending through an inter-level dielectric layer, comprising the steps of:
   depositing by a deposition process comprising chemical vapor deposition a nitrided barrier layer on sides of said hole;
   in a sputter reactor including a tantalum target, etching said nitrided barrier layer on a bottom of said hole;
   in said sputter reactor, depositing a material comprising tantalum on sidewalls of said hole to form second barrier layer;
   depositing by physical vapor deposition a copper seed layer over said second barrier layer; and
   filling by electrochemical plating copper into said hole over said copper seed layer.

13. The process of claim 12, said deposition process comprises atomic layer deposition.

14. The process of claim 12, wherein said nitrided barrier layer comprises TiSiN.

15. The process of claim 12, wherein said second barrier layer comprises TaN.

16. A method of filling one or more of a via and a trench in a patterned substrate, comprising:
   a) depositing a generally conformal first barrier layer in one or more of the via and the trench on patterned substrate by chemical vapor deposition, wherein the first barrier layer comprises a silicided nitride of a refractory metal selected from the group consisting of Ti, Ta, and W;
   b) removing the first barrier layer from horizontal surfaces of the patterned substrate;
   c) depositing a second barrier layer by physical vapor deposition; and
   d) then depositing one or more conductive materials.

17. The method of claim 16, wherein depositing the conductive material comprises depositing a seed layer and a metal layer in the via and/or the trench after the second barrier layer is deposited.

18. The method of claim 17, wherein the first barrier layer comprises a material is selected from the group consisting of Ti, Ta, W, and nitrides thereof.

19. The method of claim 17, wherein the seed layer comprises copper.

20. The method of claim 19, wherein the metal layer comprises is copper.

21. The method of claim 17, wherein the seed layer is deposited by physical vapor deposition.

22. The method of claim 17, wherein the metal layer is deposited by electroplating.

23. The method of claim 16, wherein the second barrier layer comprises at least one refractory metal selected from the group consisting of Ta and W.

24. The method of claim 16, wherein the second barrier layer comprises a material selected from the group consisting of Ta, TaN, W, WN, Ti, and TiN, and wherein the second barrier layer has a thickness of from about 2 nm to about 5 nm at the bottom of the via.

25. A method of filling one or more holes in a patterned substrate, comprising:
   a) depositing a generally conformal first barrier layer on the patterned substrate by atomic layer deposition;
   b) removing the first barrier layer from horizontal surfaces of the patterned substrate;
   c) depositing a second barrier layer by physical vapor deposition; and
   d) then depositing one or more conductive materials to fill the holes.

26. The method of claim 25, wherein depositing the conductive material comprises depositing a seed layer and a metal layer in the holes after the second barrier layer is deposited.

27. The method of claim 26, wherein the first barrier layer comprises material selected from the group consisting of Ta, TaN, W, and WN.

28. The method of claim 27, wherein the second barrier layer comprises a material selected from the group consisting of Ta, TaN, T, TiN, W, and WN.

29. The method of claim 28, wherein the seed layer comprises copper.

30. The method of claim 29, wherein the metal layer comprises copper.

31. The method of claim 26, wherein the seed layer is deposited by physical vapor deposition.

32. The method of claim 26, wherein the metal layer is deposited by electroplating.

33. The method of claim 25, wherein the second barrier layer comprises a material selected from the group consisting of Ta, TaN, W, WN, Ti, and TiN.

34. A method of filling one or more of a via and a trench in a patterned substrate, comprising:
   a) depositing a generally conformal first barrier layer on the patterned substrate by chemical vapor deposition;
   b) removing the first barrier layer from the horizontal surfaces of the patterned substrate;
   c) depositing a second barrier layer by physical vapor deposition; and
   d) then depositing depositing the conductive material comprises one or more conductive materials, wherein depositing a seed layer and a metal layer in the via and/or the trench after the second barrier layer is deposited.

35. A method of filling one or more of a via and a trench in a patterned substrate having a metal layer underlying the via, comprising:

a) depositing a generally conformal first barrier layer on the patterned substrate by chemical vapor deposition, wherein the first barrier layer comprises a silicided nitride of a refractory metal selected from the group consisting of Ti, Ta, and W;

b) removing the first barrier layer from horizontal surfaces of the patterned substrate;

c) depositing by physical vapor deposition a second barrier layer sufficient to provide a barrier on the bottom of the trench; and d) then depositing one or more conductive materials.

36. A method of filling one or more of a via and a trench in a patterned substrate having a metal layer underlying the via, comprising:

a) depositing a generally conformal first barrier layer on the patterned substrate by atomic layer deposition;

b) removing the first barrier layer from horizontal surfaces of the patterned substrate;

c) depositing by physical vapor deposition a second barrier layer sufficient to provide a barrier on a bottom of the trench; and d) then depositing one or more conductive materials.

* * * * *